United States Patent
Gudovskiy et al.

(10) Patent No.: US 10,566,955 B2
(45) Date of Patent: Feb. 18, 2020

(54) METHOD AND APPARATUS FOR ACCURATE AND EFFICIENT SPECTRUM ESTIMATION USING IMPROVED SLIDING DFT

(71) Applicant: OLYMPUS CORPORATION, Tokyo (JP)

(72) Inventors: Denis A. Gudovskiy, San Diego, CA (US); Lichung Chu, San Diego, CA (US); Shinhaeng Lee, San Diego, CA (US)

(73) Assignee: OLYMPUS CORPORATION, Tokyo (JP)

(*) Notice: Subject to any disclaimer, the term of this patent is extended or adjusted under 35 U.S.C. 154(b) by 0 days.

(21) Appl. No.: 16/063,244

(22) PCT Filed: Dec. 18, 2015

(86) PCT No.: PCT/US2015/066716
§ 371 (c)(1),
(2) Date: Jun. 15, 2018

(87) PCT Pub. No.: WO2017/105497
PCT Pub. Date: Jun. 22, 2017

(65) Prior Publication Data
US 2018/0367123 A1 Dec. 20, 2018

(51) Int. Cl.
*H03H 17/06* (2006.01)
*G06F 17/14* (2006.01)

(52) U.S. Cl.
CPC ....... *H03H 17/0671* (2013.01); *G06F 17/141* (2013.01)

(58) Field of Classification Search
None
See application file for complete search history.

(56) References Cited

U.S. PATENT DOCUMENTS 7,020,218 B2* 3/2006 Arnesen ............ H04L 27/2653
    375/316
8,559,568 B1* 10/2013 Clark ................. G06F 17/141
    375/340

(Continued)

FOREIGN PATENT DOCUMENTS

| JP | 2005-532668 | 10/2005 |
| JP | 2010-068033 | 3/2010 |
| WO | 2014085710 | 6/2014 |

OTHER PUBLICATIONS

ISR and Written Opinion for PCT/US2015/066716 dated Nov. 3, 2016, 10 pages.

(Continued)

*Primary Examiner* — Michael D. Yaary
(74) *Attorney, Agent, or Firm* — Sheppard, Mullin, Richter & Hampton LLP

(57) ABSTRACT

An improved sliding discrete Fourier transform (SDFT) algorithm called CIC-SDFT and its apparatus are provided. An input signal is multiplied by a modulated twiddle factor, and is then processed by a modified cascade integrator-comb (CIC) filter. The CIC-SDFT comprises an integrator section and a comb section, with a downsampler disposed between the two sections to enable downsampling of the SDFT computations. Through addition of more integrator stages and comb stages to the CIC-SDFT, the accuracy of spectrum estimation may be improved in a computationally inexpensive manner and with less complexity than applying windowing functions to known SDFTs. Various embodiments provide a partially-nonrecursive method of CIC-SDFT that further decreases computational complexity.

16 Claims, 9 Drawing Sheets

(56) References Cited

U.S. PATENT DOCUMENTS

2004/0125893 A1* 7/2004 Gazor ................. G01R 23/16
375/324
2014/0122205 A1 5/2014 Adnan
2015/0304146 A1* 10/2015 Yang ................. H04L 5/0066
370/329

OTHER PUBLICATIONS

Notice of Allowance dated Nov. 26, 2019 for Japanese Application No. 2018-531666.

* cited by examiner

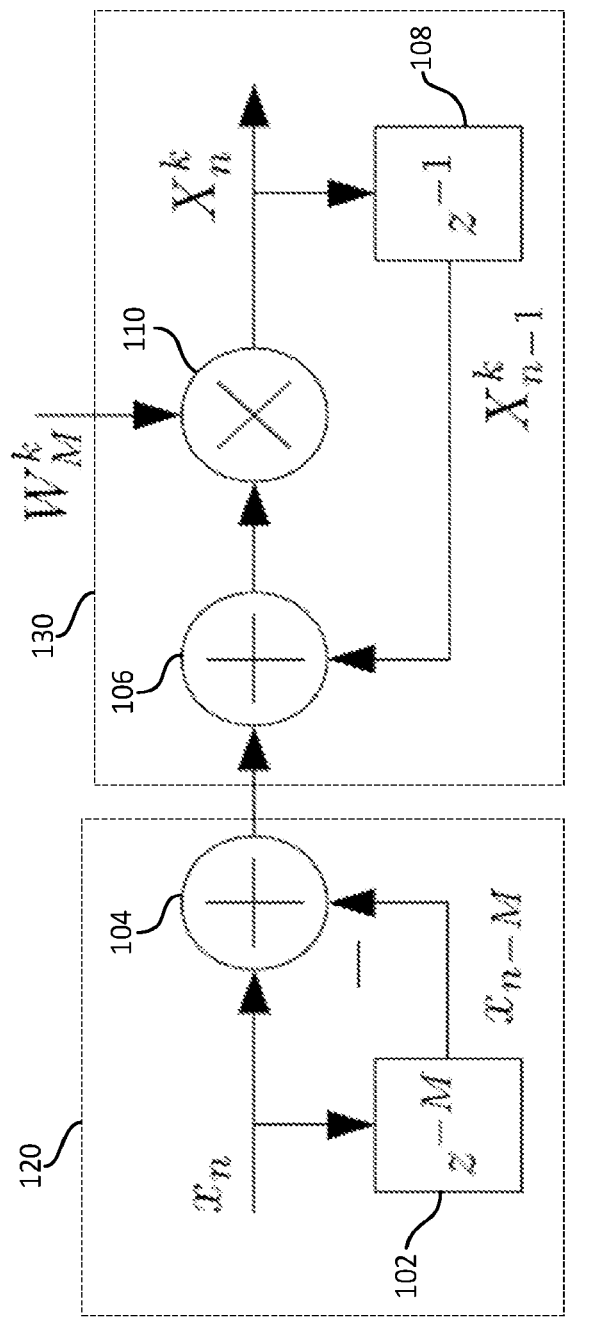
CONVENTIONAL
FIG. 1

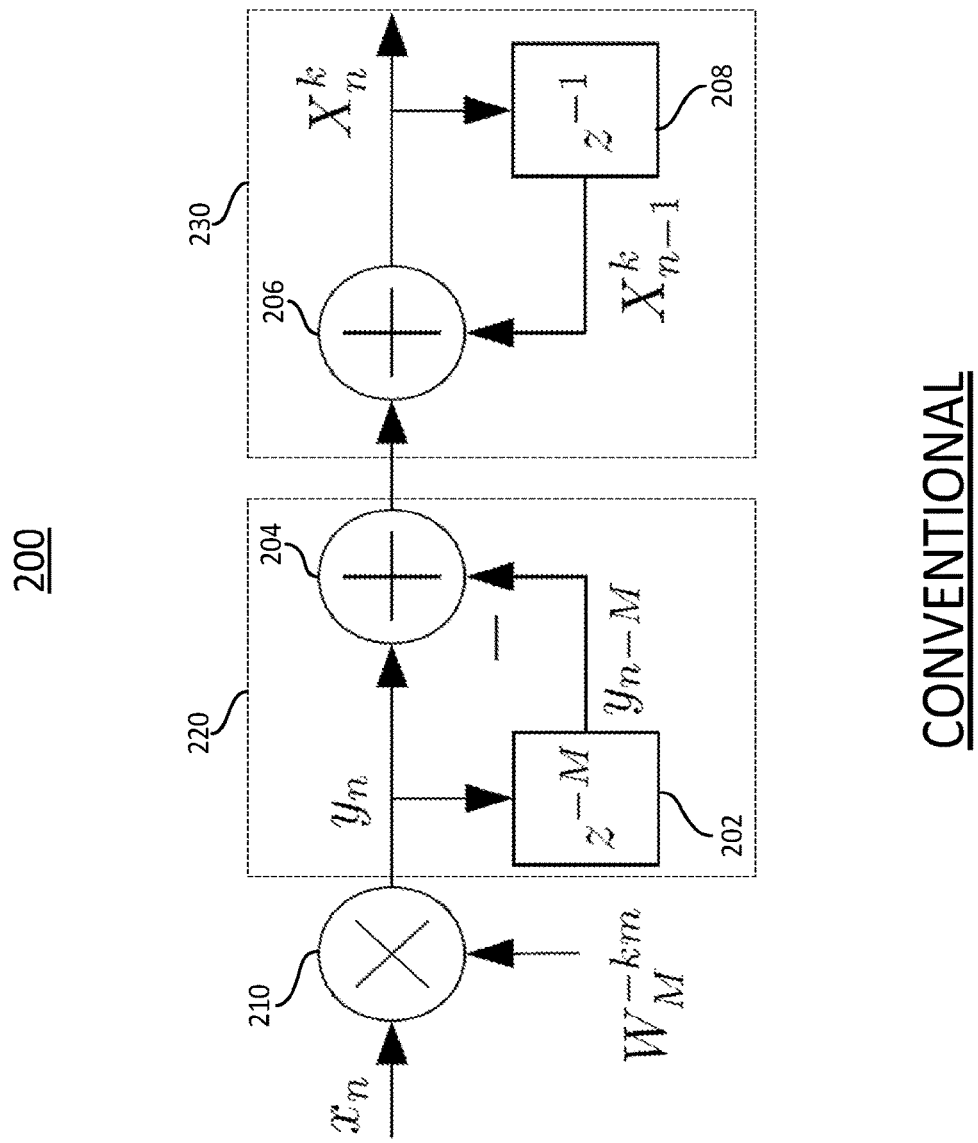
FIG. 2
CONVENTIONAL

METHOD AND APPARATUS FOR ACCURATE AND EFFICIENT SPECTRUM ESTIMATION USING IMPROVED SLIDING DFT

CROSS-REFERENCE TO RELATED PATENT APPLICATIONS

This application is a U.S. national stage entry under 35 U.S.C. 371 of International Application No. PCT/US15/66716, filed on Dec. 18, 2015, which is incorporated herein by reference in its entirety.

TECHNICAL FIELD

The disclosed technology relates generally to digital signal processing, and more particularly, some embodiments relate to devices and methods for computing an improved sliding discrete Fourier transform (SDFT) for signal processing.

BACKGROUND OF THE DISCLOSED TECHNOLOGY

A discrete Fourier transform (DFT) is a mathematical transform that converts one function from one domain to another. Specifically, a DFT is a frequency representation of the original function, the original function generally being a signal in the time domain. The input to a DFT is a finite list of equally spaced samples of a continuous signal. DFTs may be implemented in both computer algorithms executed by a general- or special-purpose processors, or directly in hardware.

A sliding discrete Fourier transform (SDFT) is a popular algorithm used in nonparametric spectrum estimation when only a few frequency bins of an M-point DFT are of interest. Although the classical SDFT algorithm is generally computationally efficient, its recursive structure suffers from accumulation and rounding errors, which can lead to instabilities or inaccurate output. One prior approach is to use a modulated SDFT algorithm, which is generally stable without sacrificing accuracy.

Conventional SDFT's may be tailored to compute a DFT on a sample-by-sample basis. However, such techniques are not generally computationally efficient when programmable output rate is needed. Some approaches have proposed a hopping SDFT algorithm for situations where computational downsampling is needed.

The typical method for spectrum analysis in digital signal processors (DSP) is the discrete Fourier transform (DFT). The DFT converts a continuous signal in a first domain (e.g., time domain) into a frequency domain representation for a discrete set of frequencies. Rather than looking for the frequency content of the continuous signal at all possible frequencies, the DFT divides up the frequency spectrum of the signal into a number of frequency hands, referred to as bins.

In some applications, however, spectrum analysis is only necessary over a subset of M frequencies of an M-point DFT. One algorithm useful in such applications is the sliding discrete Fourier transform (SDFT). The SDFT performs an M-point DFT on time samples within a sliding-window function. The SDFT computes an M-point DFT for samples within a first window position, shifts the window by one sample, and then computes another M-point DFT for samples within the new window position. Each new DFT is efficiently computed directly from the results of the previous DFT. That is, the kth frequency bin of an M-point DFT at time index n for input signal x is defined by $$X_n^k = \sum_{m=0}^{M-1} x_{q+m} W_M^{-km} \quad (1)$$

where $q=n-M+1, 0 \leq k \leq M-1$, and the complex exponential factor $W_M = e^{j2\pi/M}$ (also known as a twiddle factor).

As noted above, a sliding DFT calculates the DFT recursively. A recursive equivalent of equation (1) is given by $$X_n^k = W_M^k(X_{n-1}^k - x_{n-M} + x_n). \quad (2)$$

FIG. 1 illustrates an example circuit representation 100 implementing the conventional SDFT described above in equation (2). The structure of DFT 100 includes a comb stage 120 including a first delay block 102 and a first adder, or add block 104, and an integrator stage 130 including a second add block 106, a second delay block 108, and a multiplier 110. In various embodiments, the circuit 100 may include multiple integrator stages 130, each configured to extract a specific frequency bin of an M-point DFT.

The first delay block 102 of the comb stage 120 generates a delayed sample $x_{n-M}$. The delayed sample $x_{n-M}$ is subtracted from the current sample $x_n$ by the first add block 104. The output of the first add block 104 is provided to the integrator stage 130. In the integrator stage 130 at the second add block 106, the previous accumulation result $X_{n-1}^k$ is added to the current sample $x_n - x_{n-M}$. The multiplier 110 as a first input that receives the output of second add block 106 the output from the second add block 106, and a second input that receives a twiddle factor $W_M^k$. Multiplier 110 multiplies these two inputs to generate the weighted-sum output representing the DFT of the kth bin.

The second delay block 108 delays this output and feeds it back to second add block 106. As received by second add block 106 it is the previous result $X_{n-1}^k$ and it may be added to the modified, now-current sample outputted from the first add block 104.

Although computationally efficient, the SDFT has several drawbacks that impact its effectiveness in different applications. The recursive structure of the conventional SDFT results in only a marginally stable output because it has a z-domain pole located on the unit circle at $z=W_M^k$. Hence, it is only marginally stable in finite precision recursive calculations with accumulation, except at points when poles $z=\pm 1$ or $z=\pm j$. As the twiddle factor for the kth bin ($W_M^k$) is typically imprecise, any errors accumulate over time, leading to potential instabilities in the output. This is particularly an issue in fixed-point implementations, such as implementations in circuitry, but is also present within floating-point applications. For example, in a processing device implementing SDFT 100, the accumulated error becomes exponentially large for infinite time (e.g., for a device that is turned on and runs for a long duration). Moreover, the SDFT functions on a sample-by-sample basis only. Each conventional SDFT output must be computed for each new input sample due to the recursive structure. If a new M-point DFT output needs to be computed only every R samples (R>1), the conventional SDFT loses computational efficiency. Thus, R-times decreased output rate requires the same amount of computations as the case with R=1.

One potential solution to the issues caused due to the recursive nature of the conventional SDFT is to multiply the samples by a modulated sequence (modulated twiddle factor) prior to entering the comb stage, referred to as a modulated SDFT, or mSDFT. The mSDFT shifts each specific bin of interest ($X^k$) to the k=0 index, and then calculates the new zero-frequency DFT bin ($Y^0$) as $$X_n^k = Y_n^0 = Y_{n-1}^0 - y_{n-M} + y_n, \quad (3)$$

where $y_n = x_n W_M^{-km}$ and $y_{n-M} = x_{n-m} W_M^{-k(m-M)}$.

FIG. 2 illustrates an example circuit 200 implementing the mSDFT. The mSDFT 200 includes similar components as discussed above with respect to filter 100 of FIG. 1. In this example, mSDFT 200 includes a comb stage 220, which further includes a first delay block 202 and a first adder 204; and an integrator stage 230, which includes a second adder 206 and a second delay block 208. Unlike filter 100, the multiplier 210 of mSDFT 200 is located at the input of the filter 200, such that the input sample $x_n$ is multiplied by the modulated sequence $W_M^{-km}$ to produce $y_n$ prior to entering the comb stage 220. By removing the complex multiplication of multiplier 210 from the recursive integrator section, the specific bin of interest for the calculation ($X^k$) is shifted to the k=0 index, for which $W_M^0 = 1$ (which guarantees a stable and accurate output of the recursive section). The rest of the mSDFT 200 operates in a similar fashion as discussed above with respect to SDFT 100, except that the operations are applied to the samples $y_n$.

However, the mSDFT still poses several issues. First, the accuracy of spectrum estimation is limited due to support of only rectangular DFT windows. The complexity of more advanced windows grows faster than a linear function of window length. Second, the mSDFT still operates only on a sample-by-sample basis, without the ability to efficiently calculate the DFTs for programmable output rates R (R>1).

BRIEF SUMMARY OF EMBODIMENTS

According to various embodiments of the disclosed technology a new SDFT algorithm is provided and is based on a technique in which the algorithm moves a DFT bin index k of interest to a position k=0. This can have the effect of excluding complex coefficient multiplication in a recursive section and avoids instabilities. In addition, embodiments of the SDFT disclosed herein may be configured to include a modified cascade integrator-comb (CIC) filter structure. Such embodiments may be referred to from time to time in this document as a CIC-SDFT.

As a result, embodiments described herein may be configured to achieve two goals using the above-noted approach. First, the accuracy of spectrum estimation may be improved by using high-order CIC filters without requiring computationally expensive windowing techniques. Second, the complexity of SDFT can be further decreased by reducing the DFT output rate. Accordingly, embodiments may be achieved that are numerically stable, include advanced windowing functions, support programmable output rate (downsampling), or provide a combination of one or more of the foregoing.

According to various embodiments of the disclosed technology an apparatus for spectrum estimation, includes a signal processing circuit that includes a multiplier having a signal input, a coefficient input, and an output; and a CIC-SDFT filter circuit disposed at the output of the multiplier. In various embodiments, the CIC-SDFT filter circuit includes an integrator section comprising one or more integrator stages in series, and disposed at an input to the CIC-SDFT filter circuit; a downsampler disposed at an output of the integrator section and configured to generate a downsampled output signal; and a comb section comprising one or more comb stages in series, and disposed at an output of the downsampler.

Other features and aspects of the disclosed technology will become apparent from the following detailed description, taken in conjunction with the accompanying drawings, which illustrate, by way of example, the features in accordance with embodiments of the disclosed technology. The summary is not intended to limit the scope of any inventions described herein, which are defined solely by the claims attached hereto.

BRIEF DESCRIPTION OF THE DRAWINGS

The technology disclosed herein, in accordance with one or more various embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

FIG. 1 illustrates an example circuit 100 implementing a conventional SDFT.

FIG. 2 illustrates an example circuit 200 implementing a conventional mSDFT.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION OF THE EMBODIMENTS

Embodiments of the technology of the present disclosure are directed toward devices and methods for signal processing. More particularly, various embodiments of the technology disclosed herein implement an improved SDFT algorithm referred to as CIC-SDFT. Embodiments of the CIC-SDFT improve upon conventional SDFT structures by incorporating a modified cascaded integrator-comb (CIC) filter structure. Conventional CIC filters may be utilized in various embodiments to reduce the amount of storage necessary and the need for multipliers to develop more economical hardware solutions. In various embodiments, the modified decimating CIC filter may comprise an integrator section comprising a plurality of integrator stages and a comb section comprising a plurality of comb stages, separated by a downsampler, which provides the ability to downsample the output signal, allowing better estimation of the frequency spectrum without the need to step through on a sample-by-sample basis. More specifically, a plurality of integrator and comb stages are responsible for an efficient implementation of powerful embedded windowing function.

Figure 3:
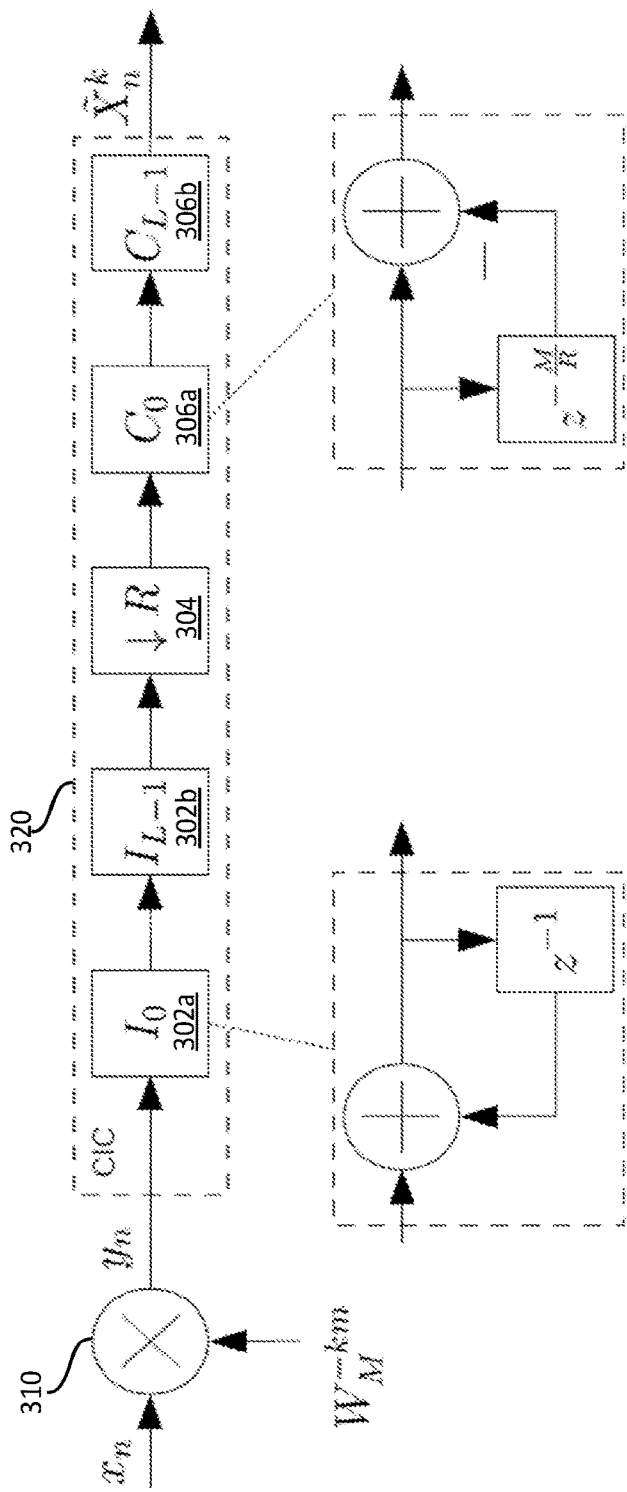
FIG. 3 illustrates an example circuit 300 in accordance with embodiments of the technology disclosed herein.

FIG. 3 illustrates an example circuit 300 in accordance with embodiments of the technology disclosed herein. The example circuit 300 includes a multiplier 310 disposed before the input of a CIC-SDFT filter 320. In the illustrated example of FIG. 3, multiplier 310 is a complex multiplier and includes a first input configured to receive an input signal, $x_n$, and a second input configured to receive a modulating sequence, $W_M^{-km}$. Multiplier 310 multiplies these two signals together to produce a modified signal $y_n$. The modified signal $y_n$ is output from multiplier 310 and input to the first input of CIC-SDFT filter 320.

The CIC-SDFT filter in this example is a modified CIC decimating filter with an R rate change. It includes two integrator stages 302a, 302b; two comb stages 306a, 306b; and a downsampler 304. In various embodiments, the CIC-SDFT filter 320 may comprise one or more integrator stages and comb stages, increasing the order (L) of the CIC-SDFT filter 320. The order of the CIC-SDFT filter 320 identifies how many integrator stages and comb stages are provided in the filter. Unlike conventional CIC decimator, which has delay of 1 or 2 samples in comb stages, the CIC-SDFT filter 300 has a delay of M/R in comb stages 306a, 306b.

In various embodiments, the same number of integrator stages and comb stages are used to account for overflow arising from the constant integration operations of the integrator stages over infinite time. By having a symmetric number of comb stages as integrator stages, the comb stages compensate for the overflow condition. The downsampler 304 functions to decrease the output rate of the integrator stages 302a, 302b by a factor R, such that the integrator stages 302a, 302b operate at a higher sampling rate than the comb stages 306a, 306b.

Embodiments of the CIC-SDFT may be configured to improve upon the mSDFT approach discussed above with reference to FIG. 2. The mSDFT structure illustrated in FIG. 2 implements the recursive form for calculating the zero-frequency DFT bin $Y^0$ as $$Y_n^0 = \sum y_{q+m} W_m^0 = \sum_{m=0}^{M-1} y_{q+m} = Y_{n-1}^0 - y_{n-M} + y_n, \quad (4)$$

which resembles a reordered first order CIC filter with an additional complex multiplier by $W_M^{-km}$. More specifically, Equation (4) describes a moving average, which can be computed by a first order CIC filter without rate change.

In various embodiments, the CIC-SDFT filter 320 of the circuit 300 is equivalent to L cascades of moving average filters with a transfer function expressed as $$H(z) = \frac{(1-z^{-M})^L}{(1-z^{-1})^L} = \left(\sum_{m=0}^{M-1} z^{-m}\right)^L. \quad (5)$$

The magnitude response for the CIC-SDFT filter 320, evaluated at $z=e^{j\omega}$, can be expressed as $$|H(\omega)| = \left|\frac{\sin M\omega/2}{\sin \omega/2}\right|^L, \quad (6)$$

where the magnitude response $|H(\omega)|$ is a window function $W(\omega)$ applied to the discrete-time Fourier transform (DTFT) when the finite length DFT is being computed. In various embodiments, the gain of the CIC-SDFT 300 may be $M^L$. In addition, the CIC-SDFT filter 320 can presume bit growth. If the input has $B_{in}$ bits, all computations may be made with bit-width $B=\lceil L \log_2(M)\rceil+B_{in}$.

By increasing the order of the CIC-SDFT filter, improved spectral leakage may be achieved due to the naturally embedded windowing function of the CIC-SDFT filter ($W(\omega)$). Equation (6), above, shows that for a filter order of L=1, CIC-SDFT provides an exact DFT spectrum. However, the spectral resolution and spectral leakage can be improved by increasing the filter order L, which is equivalent to higher order $W(\omega)$. For example, $W_{L=1}(\omega)$ corresponds to a rectangular window of length M in the time-domain and $W_{L=2}(\omega)$ corresponds to a triangular window of length (2M−1) in the time-domain and so on. An example of this is shown in FIG. 4.

Figure 4:
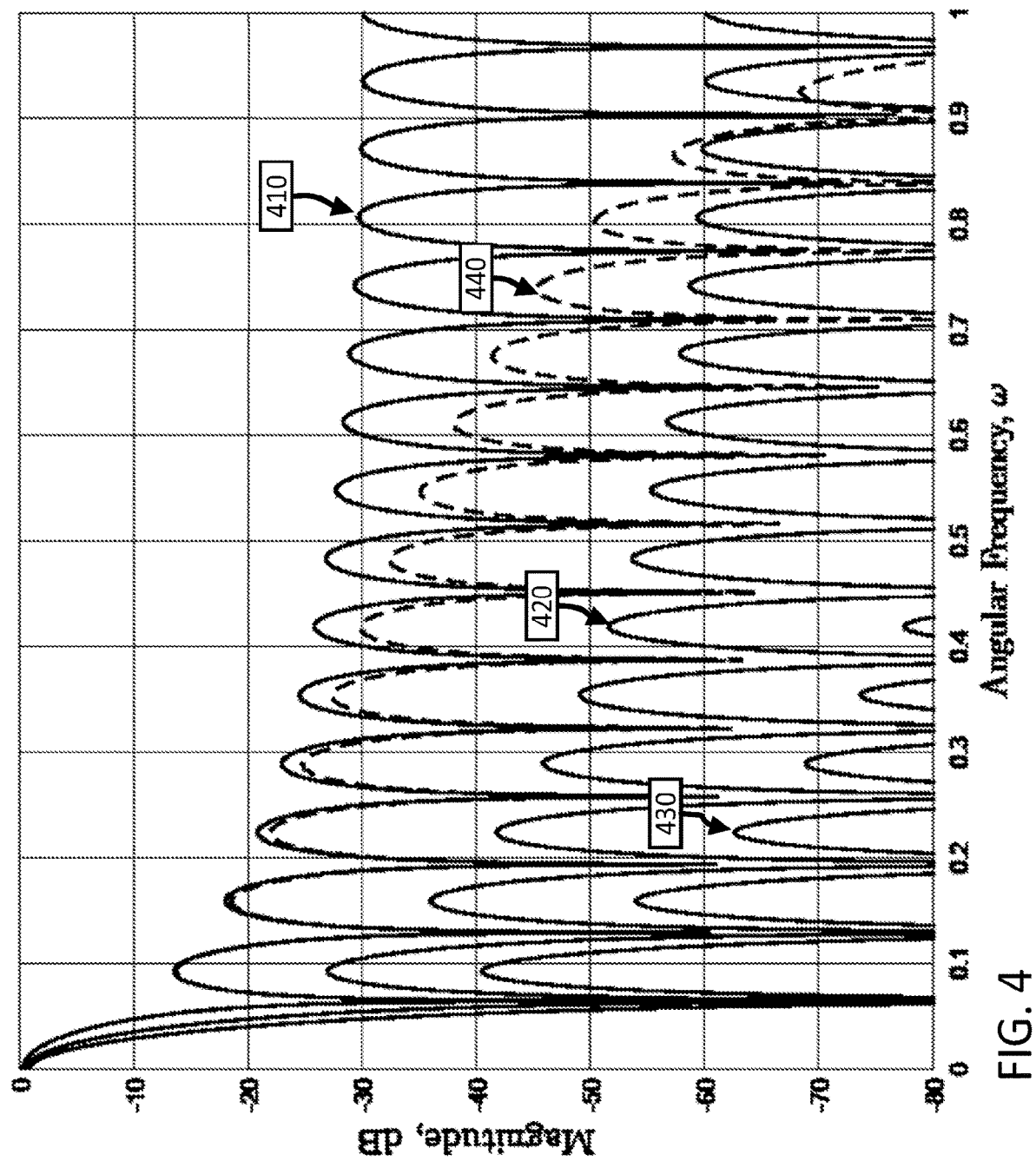
FIG. 4 is a representation of a magnitude response for the example circuit 300 of FIG. 3 (as the order of the CIC-SDFT filter 320 increases), and a Hanning window applied to a conventional SDFT, in accordance with embodiments of the technology disclosed herein.

FIG. 4 is a representation of a magnitude response for the example circuit 300 of FIG. 3 (as the order of the CIC-SDFT filter 320 increases), and a Hanning window applied to a conventional SDFT, in accordance with embodiments of the technology disclosed herein. A circuit with a CIC-SDFT filter of order L=1 is shown by curve 410. The curve 410 represents an exact DFT spectrum, as established by equation (6) (as noted above).

Curves 420 and 430 illustrate performance with higher filter orders. The curve 420 represents the magnitude response for a second-order CIC-SDFT filter, such as the CIC-SDFT filter 320 of FIG. 3. As illustrated in FIG. 4, by increasing the order of the CIC-SDFT filter (from L=1 to L=2), embodiments of the technology disclosed herein enable a 13 dB improvement in the sidelobe attenuation. By increasing the order to L=3, as represented in the curve 430, an even greater improvement (26 dB) in the sidelobe attenuation. The estimation improvement is generated with minimal complexity, as each increase in filter order requires only the addition of an another integrator stage and comb stage pair to the CIC-SDFT filter.

Curve 440 represents the magnitude response of a conventional SDFT with the optimized Hanning windowing. For conventional SDFT, to improve the accuracy of the estimate (i.e., decrease sidelobes), a very high complexity is required, which increases the expense of applying windowing to conventional SDFT. A very common window function is the Hanning window function. In FIG. 4, the optimized Hanning window of length 5 is applied, having nonzero coefficients −¼, ½, and −¼. As can been seen, the curves 420, 430 provide a greater increase in accuracy of the spectrum estimate, at much less expense, as compared with the highly complex and expensive windowing of conventional SDFT.

Referring back to FIG. 3, embodiments of the technology disclosed herein implementing technology such as the example circuit 300 result in reduced computational workload compared to other SDFT approaches. The complexity may be reduced for R>1 in a similar way as in CIC decimators, and thereby providing flexibility to the accuracy of the spectrum estimation, based on the requirements of a given implementation. As discussed above, where the CIC-SDFT filter is of the first order, and where R=1 (i.e., no downsampling), the circuit 300 performs the same number of operations as the mSDFT approach. When R>1, the comb stages 306a, 306b operate at $f_s/R$ sampling rate, and the memory size in the comb stages 306a, 306b may be reduced by R. This is a significant reduction in computation, enabling highly accurate spectrum estimation with a simplified circuit implementation as compared to applying Hanning windowing to the conventional SDFT illustrated in FIG. 1.

Figure 5:
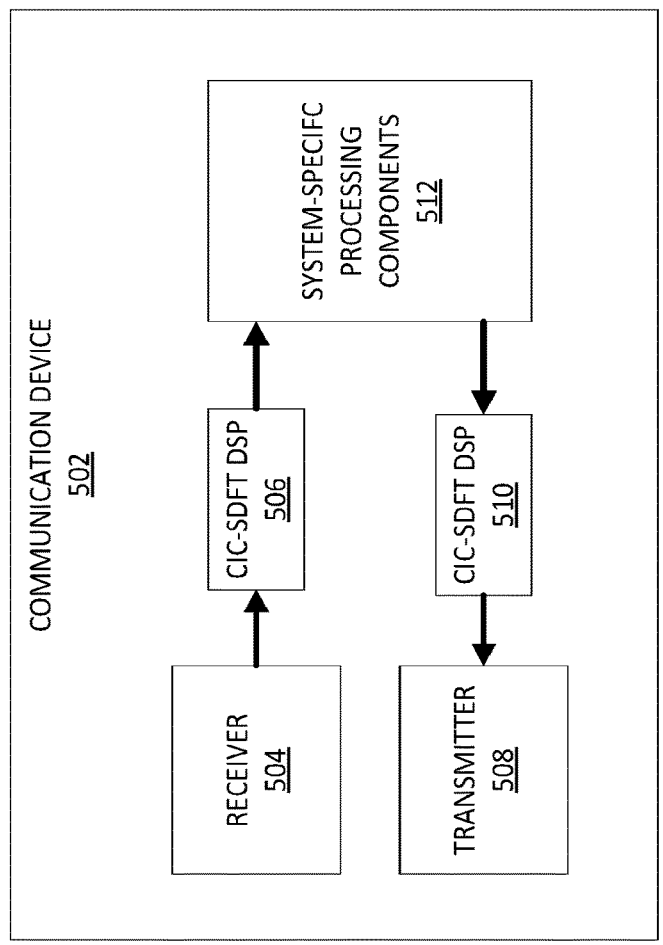
FIG. 5 illustrates an example system environment 500 in accordance with embodiments of the present disclosure.

Embodiments of the CIC-SDFT filter may be implemented within a variety of different systems conducting signal processing, including digital signal processing. FIG. 5 illustrates an example system environment 500 in accordance with embodiments of the present disclosure. The system 500 includes a communication device 502, which may include or may be part of communications equipment or other devices including RF communication capabilities. In various embodiments, the communication device 502 may comprise one or more of a variety of processing equipment based on the specific implementation for which communication device 502 is designed. Embodiments implementing the CIC-SDFT filter are applicable to a wide range of digital signal processing applications, including but not limited to: audio processing; image processing; digital communications; radar; sonar; industrial processing; medical applications, such as CAT scans; receiver signal strength (RSS) estimation; or receiver synchronization; among others. Accordingly, the communication device 502 may include, for example, a radio; a cellular telephone; a smartphone; a media playback device, such as an MP3, DVD, or Blu-ray player; imaging scanners or devices; radar or other positioning equipment; or spectrum analyzers; among others.

In various embodiments, the communication device 502 may include a receiver 504, a transmitter 508, or a combination thereof. Some embodiments may include multiple receivers 504, transmitters 508, or a combination of both, each configured to receive and/or transmit multiple signals over a plurality of data channels within a network. A CIC-SDFT DSP 506, 510 may be connected to the receiver 504, transmitter 508, or combination of both. In various embodiments, the communication device 502 may include additional system-specific processing components 512 configured to perform specific types of analysis based on the particular implementation for which the communication device 502 is designed.

In various embodiments, the CIC-SDFT filter may experience bit growth within the circuit. That is, if the input to the filter has $B_{in}$ bits, all computations are made with bit-width $$B = \lceil L \log_2(M) \rceil + B_{in}. \quad (7)$$

As the number of cascades (i.e., with higher order CIC-SDFT filters included within the DSP circuit) and the length M of the DFT increases, wider bit-widths are necessary. Various embodiments of the technology disclosed herein may address bit growth by implementing a partially-nonrecursive structures within the CIC-SDFT filter of the DSP circuit. Such partially-nonrecursive structures achieve computational simplicity through polynomial factoring and applying polyphase decomposition. The transfer function of the CIC-SDFT filter circuit 620 can be written as $$H(z) = \left(\sum_{m=0}^{M-1} z^{-m}\right)^L = (1+z^{-1})^L(1+z^{-2})^L(1+z^{-4})^L \ldots (1+z^{-2^{J-1}})^L, \quad (8)$$

for power of two DFT length $M=2^J$. Assuming a power of two downsampling factor $R=2^I$, Equation (8) can be rewritten as $$H(z) = \underbrace{(1+z^{-1})^L(1+z^{-2})^L \ldots (1+z^{-2^{I-1}})^L}_{\text{nonrecursive part I}} \quad (9)$$

$$\underbrace{(1+z^{-2^I}) \ldots (1+z^{-2^{J-1}})^L}_{\text{nonrecursive part II}} = H_{N_I}(z) H_{N_{II}}(z)$$

Assuming that the first nonrecursive part is followed by a downsampler by R, the second nonrecursive part $H_{N_{II}}(z)$ can be simplified as $$H_{N_{II}}(z) = (1+z^{-1})^L \ldots \left(1+z^{-2^{J-I-1}}\right)^L = \left(\sum_{k=0}^{M/R-1} z^{-k}\right)^L = H_R(z). \quad (10)$$

Therefore, the transfer function H (z) of the DSP circuit may be split into a nonrecursive portion $H_{N_I}(z)=H_N$ (z) and a recursive portion $H_R(z)$.

The first nonrecursive part $H_N$ (z) comprises I stages where each stage increases bit-width by Lbits, and then downsamples the output by R=2. For each stage, which calculates $(1+z^{-1})^L$, various implementations are possible. For example, the stage may be realized as length-L cascade of $(1+z^{-1})$ operations or direct exponentiation of the whole stage. Such an implementation may be expressed for transfer function $H_c(z)$ and L=4 as $$H_c(z) = (1+z^{-1})^4 = \quad (11)$$

$$\prod^4 (1-z^{-1}) = 1 + 6z^{-2} + z^{-4} + 4z^{-1}(1+z^{-2}) = H_{c_1}(z) + H_{c_2}(z)$$

where $H_{c_1}(z)$ and $H_{c_2}$ (z) are new polyphase components, which experience bit growth of only $L \log_2(R)$. Accordingly, the total bit-width at the output of the nonrecursive portion $H_N(z)$ is $$B_N = L \log_2(R) + B_{in}. \quad (12)$$

In view of the polyphase components of the nonrecursive part $H_N(z)$, the second recursive part $H_R(z)$ may implement only an Lth order moving-average filter, which may be realized through a cascade of L stages. Each stage of the cascade of the recursive part $H_R(z)$ may contain a comb block followed by an integrator block. Accordingly, the bit-widths increase by only $\log_2 (M/R)=(J-I)$ bits per stage.

Figure 6:
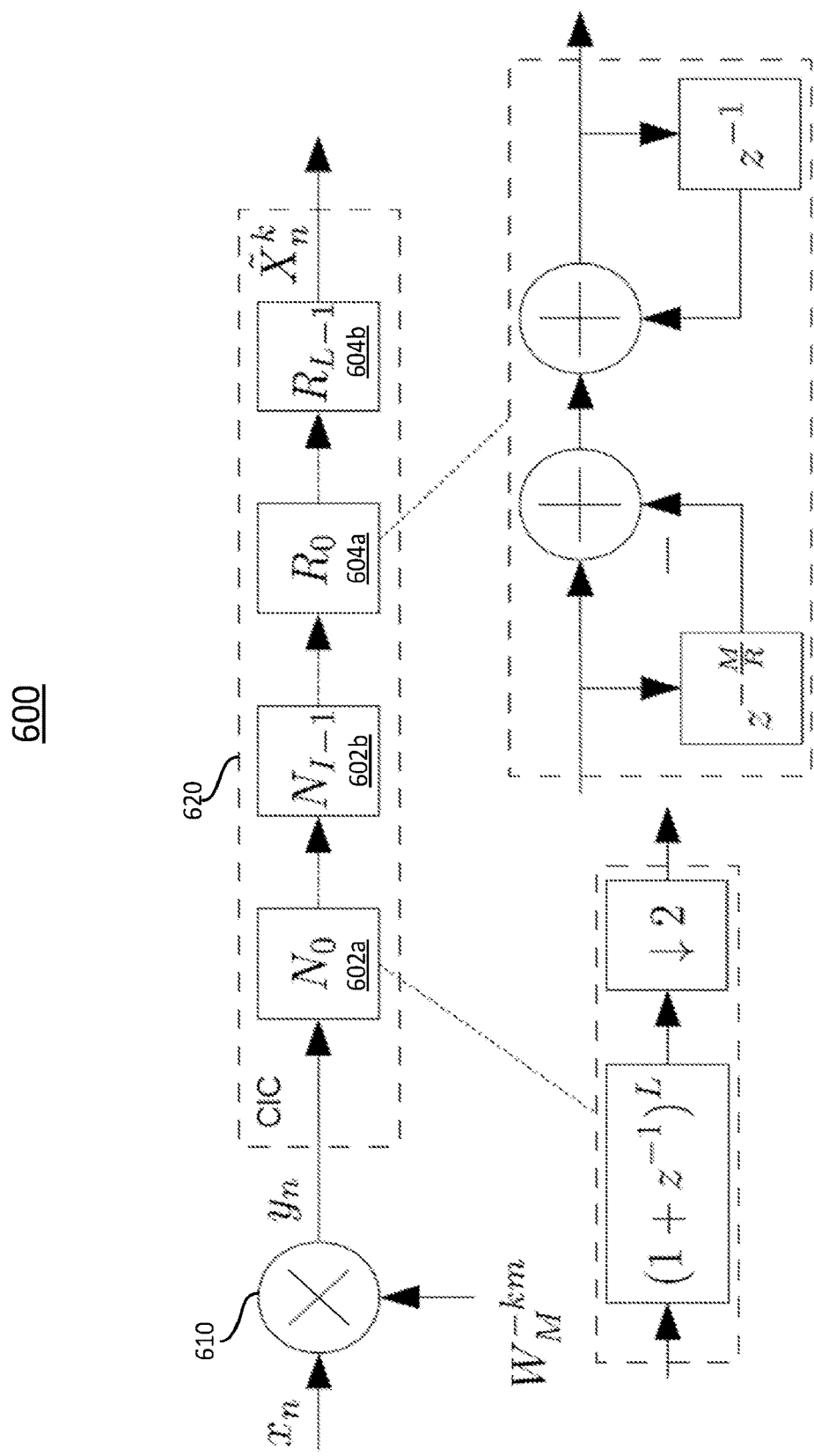
FIG. 6 illustrates an example circuit 600 in accordance with embodiments of the technology disclosed herein.

FIG. 6 illustrates an example DSP circuit 600 in accordance with the technology disclosed herein. The example DSP circuit 600 is configured in a similar manner as the DSP circuit 300 of FIG. 3, having a multiplier 610 disposed to apply a modulated twiddle factor $W_M^{-km}$ to an input signal $x_n$ to generate a modified signal $y_n$. The CIC-SDFT filter 620 receives the signal $y_n$, and includes nonrecursive stages 602a, 602b and recursive stages 604a, 604b. In various embodiments, the CIC-SDFT filter 620 embodies the nonrecursive and recursive stages discussed above with respect to equations (8) to (12). In various embodiments, each nonrecursive stage 602a, 602b calculates $(1+z^{-1})^L$ and downsamples the output by R=2. Multiple recursive stages (and a proper exponentiation factor in nonrecursive stages) may be included within the CIC-SDFT filter 620 in some embodiments to increase the order of the CIC-SDFT filter 620. In this way, the DSP circuit 600 may have a naturally embedded windowing function similar to the DSP circuit 300 of FIG. 3.

Due to the fact that bit-widths are increased on a per stage basis rather than all at once at the input of the CIC-SDFT filter, computational and hardware complexity is decreased. Less complexity is needed to account for increases in bit-width as the length of the computed DFT increases, enabling less and simpler hardware structures to be utilized. Moreover, the addition of downsampling capability in the nonrecursive stages 602a, 602b (such that downsampling is performed as early as possible, less add operations are needed, reducing the hardware complexity further.

Figure 7:
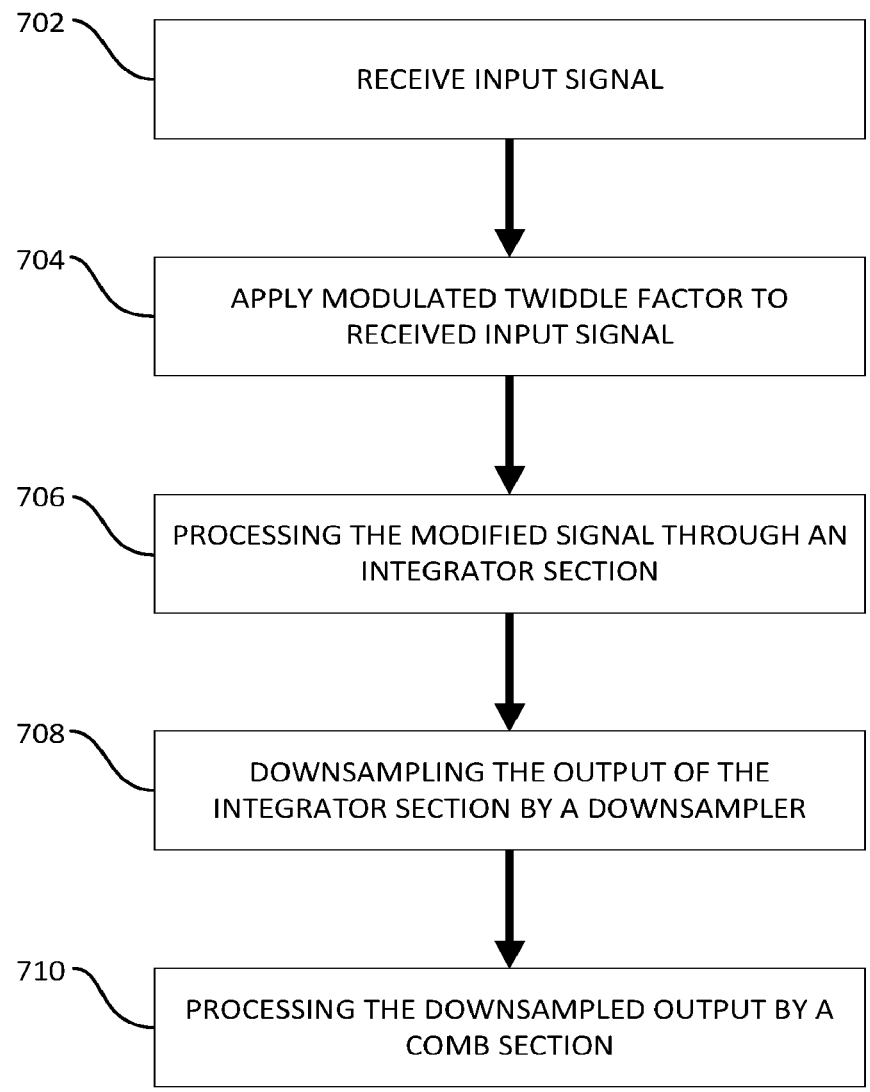
FIG. 7 is operational flow diagram 700 illustrating an example of CIC-SDFT method in accordance with embodiments of the technology disclosed herein.

FIG. 7 illustrates an operational flow diagram of CIC-SDFT method 300 in accordance with embodiments of the technology disclosed herein. At 702, an input signal is received. In various embodiments, the input signal may comprise one or more signals received over a network. Non-limiting examples of networks include: GSM; UMTS; CDMA2000; LTE; WiMAX; Wi-Fi; cable or DSL communications; satellite communication; radio; Bluetooth; fiber-optic; or near-field communication (NFC); among others. The input signal may be received by a device having a receiver and/or transmitter in various embodiments.

At 704, a modulated twiddle factor is applied to the received input signal. The application of the modulated twiddle factor may be determined in a manner similar to that discussed above with respect to FIG. 3. After application of the modulated twiddle factor, a modified signal is outputted.

At 706, the modified signal is processed through an integrator section. In various embodiments, the integrator section may include one or more integrator stages. Each of the one or more integrator stages may add a previous output to the modified signal, whereby the previous output is generated by a delay block, similar to the integrator stage discussed above with respect to FIG. 3. The number of integrator stages included in the integrator section may vary depending on the level of accuracy in spectrum estimation required for a particular application. Each integrator stage may implement a different delay value, such that a multiple previous outputs may be added to the modified signal.

At 708, the output from the integrator section is downsampled by a factor of R, similar to the downsampler discussed above with respect to FIG. 3. The downsample rate may be hard coded in some embodiments such that the output from the integrator section is always downsampled according to the same sampling rate for all computations. In various embodiments, the downsampler may be programmable by a user, such that the user may enter one of plurality of downsampling rates into the downsampler.

At 710, the downsampled output is processed by a comb section. In various embodiments, the comb section comprises one or more comb stages, each of the one or more comb stages configured to subtract a delayed sample from the downsampled output. The number of comb stages included within the comb section may be symmetric with the number of integrator stages in the integrator section, as discussed above with respect to FIG. 3.

Figure 8:
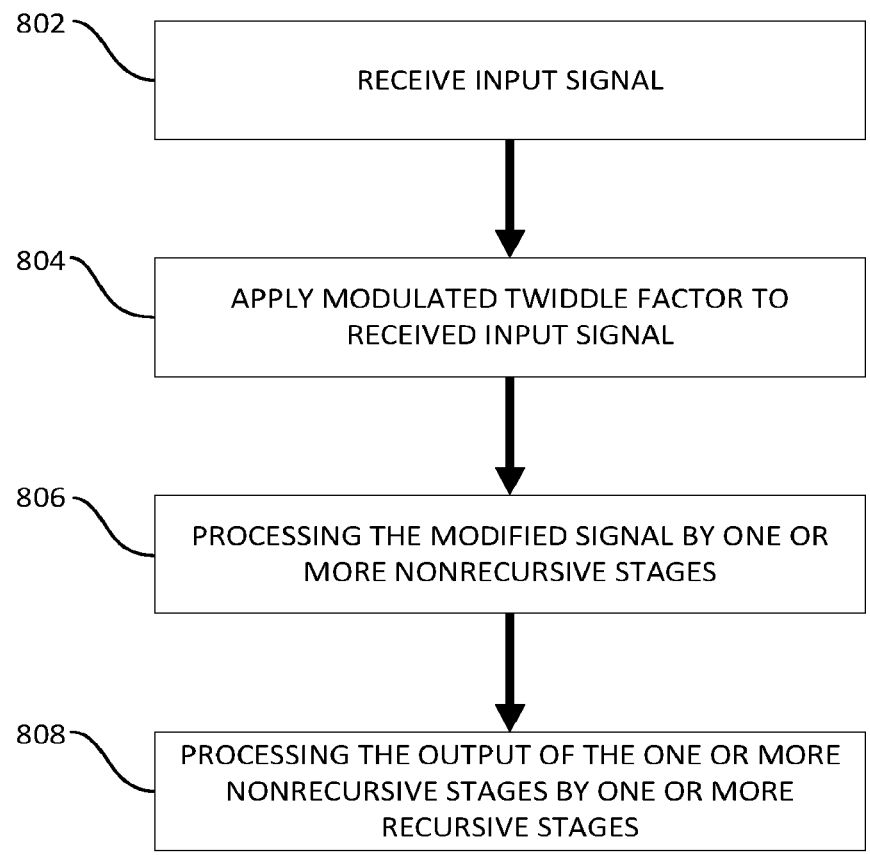
FIG. 8 is operational flow diagram 800 illustrating another example of CIC-SDFT method in accordance with embodiments of the technology disclosed herein.

FIG. 8 illustrates an operational flow diagram of partially-nonrecursive CIC-SDFT method 600 in accordance with embodiments of the technology disclosed herein. In various embodiments, 802 and 804 of the example method 800 of FIG. 8 may be performed in a similar manner as 702 and 704 discussed with respect to FIG. 7.

At 806, the modified signal outputted from 804 may be processed by one or more nonrecursive stages. In various embodiments, the nonrecursive stages may operate in a similar manner as the nonrecursive stages discussed above with respect to FIG. 6. In various embodiments, each of the one or more nonrecursive stages may include a downsampler configured to downsample the modified signal prior to exiting the respective nonrecursive stage.

At 808, the output of the one or more nonrecursive stages may be processed by one or more recursive stages. In various embodiments, the recursive stages may operate in a similar manner as the recursive stages discussed above with respect to FIG. 6.

As used herein, the term set may refer to any collection of elements, whether finite or infinite. The term subset may refer to any collection of elements, wherein the elements are taken from a parent set; a subset may be the entire parent set. The term proper subset refers to a subset containing fewer elements than the parent set. The term sequence may refer to an ordered set or subset. The terms less than, less than or equal to, greater than, and greater than or equal to, may be used herein to describe the relations between various objects or members of ordered sets or sequences; these terms will be understood to refer to any appropriate ordering relation applicable to the objects being ordered.

Figure 9:
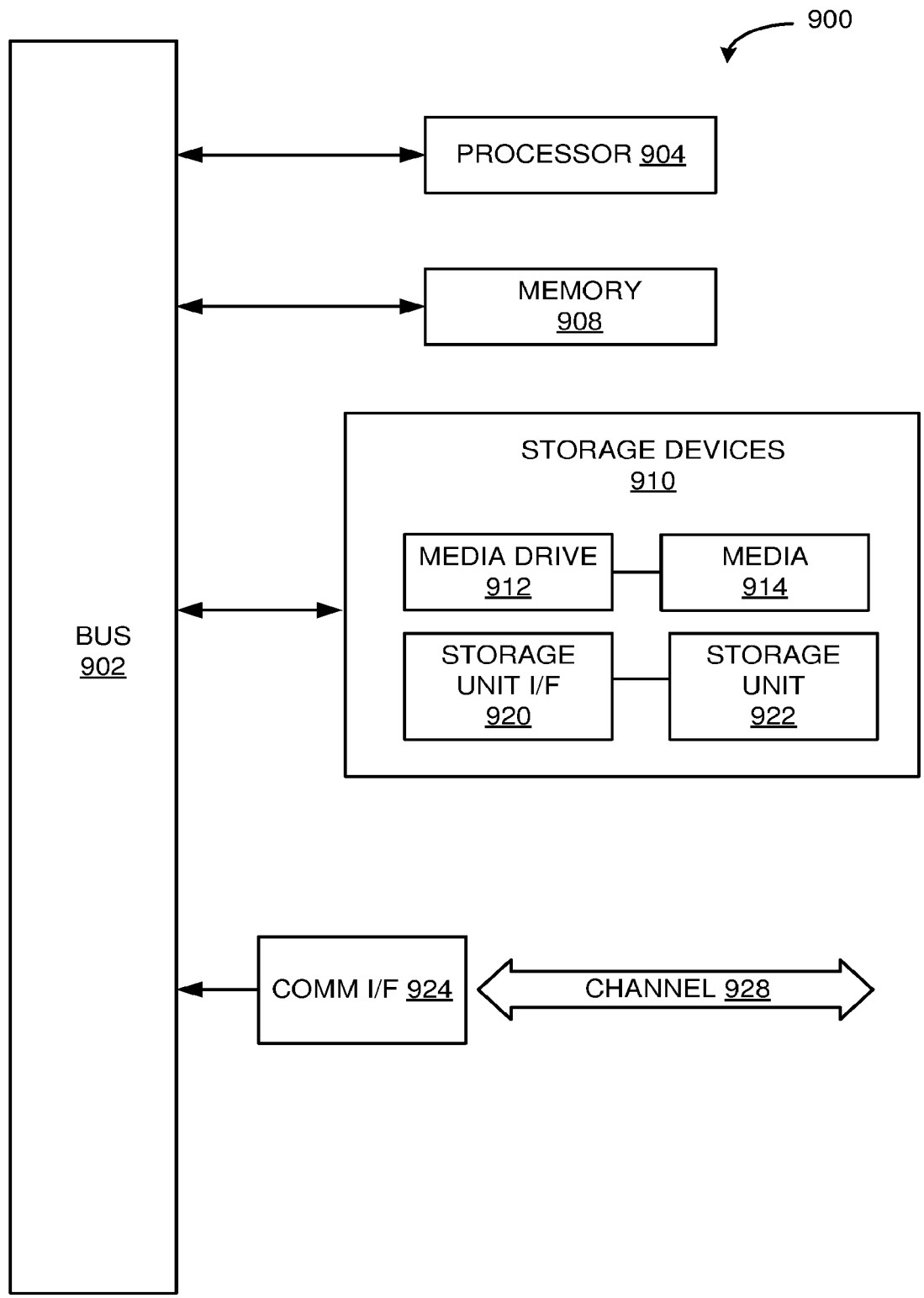
FIG. 9 illustrates an example computing component that may be used in implementing various features of embodiments of the disclosed technology.

As used herein, the terms component or block might describe a given unit of functionality that can be performed in accordance with one or more embodiments of the technology disclosed herein. As used herein, a component might be implemented utilizing any form of hardware, software, or a combination thereof. For example, one or more processors, controllers, ASICs, PLAs, PALs, CPLDs, FPGAs, logical components, software routines or other mechanisms might be implemented to make up a component. In implementation, the various components described herein might be implemented as discrete components or the functions and features described can be shared in part or in total among one or more components. In other words, as would be apparent to one of ordinary skill in the art after reading this description, the various features and functionality described herein may be implemented in any given application and can be implemented in one or more separate or shared components in various combinations and permutations. Even though various features or elements of functionality may be individually described or claimed as separate components, one of ordinary skill in the art will understand that these features and functionality can be shared among one or more common software and hardware elements, and such description shall not require or imply that separate hardware or software components are used to implement such features or functionality.

Where components or components of the technology are implemented in whole or in part using software, in one embodiment, these software elements can be implemented to operate with a computing or processing component capable of carrying out the functionality described with respect thereto. One such example computing component is shown in FIG. 9. Various embodiments are described in terms of this example-computing component 900. After reading this description, it will become apparent to a person skilled in the relevant art how to implement the technology using other computing components or architectures.

Referring now to FIG. 9, computing component 900 may represent, for example, computing or processing capabilities found within desktop, laptop and notebook computers; hand-held computing devices (PDA's, smart phones, cell phones, palmtops, etc.); mainframes, supercomputers, workstations or servers; or any other type of special-purpose or general-purpose computing devices as may be desirable or appropriate for a given application or environment. Computing component 900 might also represent computing capabilities embedded within or otherwise available to a given device. For example, a computing component might be found in other electronic devices such as, for example, digital cameras, navigation systems, cellular telephones, portable computing devices, modems, routers, WAPs, terminals and other electronic devices that might include some form of processing capability.

Computing component 900 might include, for example, one or more processors, controllers, control components, or other processing devices, such as a processor 904. Processor 904 might be implemented using a general-purpose or special-purpose processing engine such as, for example, a microprocessor, controller, or other control logic. In the illustrated example, processor 904 is connected to a bus 902, although any communication medium can be used to facilitate interaction with other components of computing component 900 or to communicate externally.

Computing component 900 might also include one or more memory components, simply referred to herein as main memory 908. For example, preferably random access memory (RAM) or other dynamic memory, might be used for storing information and instructions to be executed by processor 904. Main memory 908 might also be used for storing temporary variables or other intermediate information during execution of instructions to be executed by processor 904. Computing component 900 might likewise include a read only memory ("ROM") or other static storage device coupled to bus 902 for storing static information and instructions for processor 904.

The computing component 900 might also include one or more various forms of information storage mechanism 910, which might include, for example, a media drive 912 and a storage unit interface 920. The media drive 912 might include a drive or other mechanism to support fixed or removable storage media 914. For example, a hard disk drive, a floppy disk drive, a magnetic tape drive, an optical disk drive, a CD or DVD drive (R or RW), or other removable or fixed media drive might be provided. Accordingly, storage media 914 might include, for example, a hard disk, a floppy disk, magnetic tape, cartridge, optical disk, a CD or DVD, or other fixed or removable medium that is read by, written to or accessed by media drive 912. As these examples illustrate, the storage media 914 can include a computer usable storage medium having stored therein computer software or data.

In alternative embodiments, information storage mechanism 910 might include other similar instrumentalities for allowing computer programs or other instructions or data to be loaded into computing component 900. Such instrumentalities might include, for example, a fixed or removable storage unit 922 and an interface 920. Examples of such storage units 922 and interfaces 920 can include a program cartridge and cartridge interface, a removable memory (for example, a flash memory or other removable memory component) and memory slot, a PCMCIA slot and card, and other fixed or removable storage units 922 and interfaces 920 that allow software and data to be transferred from the storage unit 922 to computing component 900.

Computing component 900 might also include a communications interface 924. Communications interface 924 might be used to allow software and data to be transferred between computing component 900 and external devices. Examples of communications interface 924 might include a modem or softmodem, a network interface (such as an Ethernet, network interface card, WiMedia, IEEE 802.XX or other interface), a communications port (such as for example, a USB port, IR port, RS232 port Bluetooth® interface, or other port), or other communications interface. Software and data transferred via communications interface 924 might typically be carried on signals, which can be electronic, electromagnetic (which includes optical) or other signals capable of being exchanged by a given communications interface 924. These signals might be provided to communications interface 924 via a channel 928. This channel 928 might carry signals and might be implemented using a wired or wireless communication medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to media such as, for example, memory 908, storage unit 920, media 914, and channel 928. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing component 900 to perform features or functions of the disclosed technology as discussed herein.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent component names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "component" does not imply that the components or functionality described or claimed as part of the component are all configured in a common package. Indeed, any or all of the various components of a component, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. An apparatus for spectrum estimation, comprising:
a signal processing circuit comprising:
   a multiplier having a signal input, a coefficient input, and an output; and
   a cascaded integrator-comb sliding discrete Fourier transform (CIC-SDFT) filter circuit disposed at the output of the multiplier, the CIC-SDFT filter circuit comprising:
      one or more nonrecursive stages in series, and disposed at an input to the CIC-SDFT filter circuit; and
      one or more recursive stages in series comprising a cascade of moving-average filters, and disposed at an output of a final nonrecursive stage of the one or more nonrecursive stages.

2. The apparatus of claim 1, the CIC-SDFT filter circuit comprising:
   an integrator section comprising one or more integrator stages in series, and disposed at an input to the CIC-SDFT filter circuit;
   a downsampler disposed at an output of the integrator section and configured to generate a downsampled output signal; and
   a comb section comprising one or more comb stages in series, and disposed at an output of the downsampler.

3. The apparatus of claim 2, wherein a downsampling rate of the downsampler is permanent.

4. The apparatus of claim 2, wherein a downsampling rate of the downsampler may be set by a user.

5. The apparatus of claim 2, the integrator stages configured to add a previous output value to a modified output of the multiplier.

6. The apparatus of claim 2, the comb stages configured to subtract a time delayed sample value from the downsampled output signal.

7. The apparatus of claim 1 each of the one or more nonrecursive stages configured to calculate $(1+z^{-1})^L$, where L is a CIC filter order to be computed by the signal processing circuit.

8. The apparatus of claim 1, each of the one or more nonrecursive stages comprising a downsampler.

9. The apparatus of claim 8, the downsampler configured to downsample the modified input signal processed by the nonrecursive stage by 2.

10. The apparatus of claim 1, wherein a number of nonrecursive stages is equal to log 2 of downsampling rate R and a number of recursive stages equal to filter order L.

11. The apparatus of claim 1, wherein the signal processing circuit comprises a digital signal processing circuit.

12. The apparatus of claim 11, wherein the digital signal processing circuit comprises at least one of a digital signal processor, an ASIC and a FPGA.

13. A method for improved spectrum estimation, comprising:
   a signal processing circuit receiving an input signal;
   the signal processing circuit multiplying the input signal by a modulated twiddle factor to create a modified input signal;
   the signal processing circuit processing the modified input signal through one or more nonrecursive stages; and
   the signal processing circuit processing an output of a last of the one or more nonrecursive stages through one or more recursive stages, which comprise a cascade of moving-average filters.

14. The method of claim 13, each of the one or more nonrecursive stages configured to calculate $(1+z^{-1})^L$, where L is a CIC filter order to be computed by the digital signal processing circuit.

15. The method of claim 13, each of the one or more nonrecursive stages comprising a downsampler.

16. The method of claim 13, wherein the signal processing circuit comprises at least one of a digital signal processor, an ASIC and a FPGA.

* * * * *